US008378234B2

(12) United States Patent
Lux

(10) Patent No.: US 8,378,234 B2
(45) Date of Patent: Feb. 19, 2013

(54) HOUSING FOR AN ELECTRICAL DEVICE

(75) Inventor: Karl-Heinz Lux, Weikersheim (DE)

(73) Assignee: BARTEC GmbH, Bad Mergentheim (DE)

( * ) Notice: Subject to any disclaimer, the term of this patent is extended or adjusted under 35 U.S.C. 154(b) by 301 days.

(21) Appl. No.: 12/858,500

(22) Filed: Aug. 18, 2010

(65) Prior Publication Data

US 2011/0044018 A1    Feb. 24, 2011

(30) Foreign Application Priority Data

Aug. 18, 2009  (DE) .................. 10 2009 037 948

(51) Int. Cl.
*H01R 13/502* (2006.01)
*H01L 23/28* (2006.01)

(52) U.S. Cl. ...................... 174/521; 174/560

(58) Field of Classification Search ............. 257/683; 174/392, 560, 521
See application file for complete search history.

(56) References Cited

U.S. PATENT DOCUMENTS

| 5,001,299 | A  | * | 3/1991 | Hingorany ............ 174/521 |
| 5,760,336 | A  | * | 6/1998 | Wang .................. 174/535 |
| 6,521,830 | B1 | * | 2/2003 | Platz ................... 174/50 |
| 6,576,832 | B2 | * | 6/2003 | Svarfvar et al. ...... 174/392 |

FOREIGN PATENT DOCUMENTS

DE    42 21 987 A1    1/1994

* cited by examiner

*Primary Examiner* — Hung Ngo
(74) *Attorney, Agent, or Firm* — Gudrun E. Huckett

(57) ABSTRACT

A case for an electric device has a case part with sidewalls and a cover connected to the sidewalls, wherein the sidewalls and the cover enclose an explosion-protected interior in which electric and/or electronic components are accommodated. A case reinforcement is disposed in the sidewalls and in the cover.

14 Claims, 4 Drawing Sheets

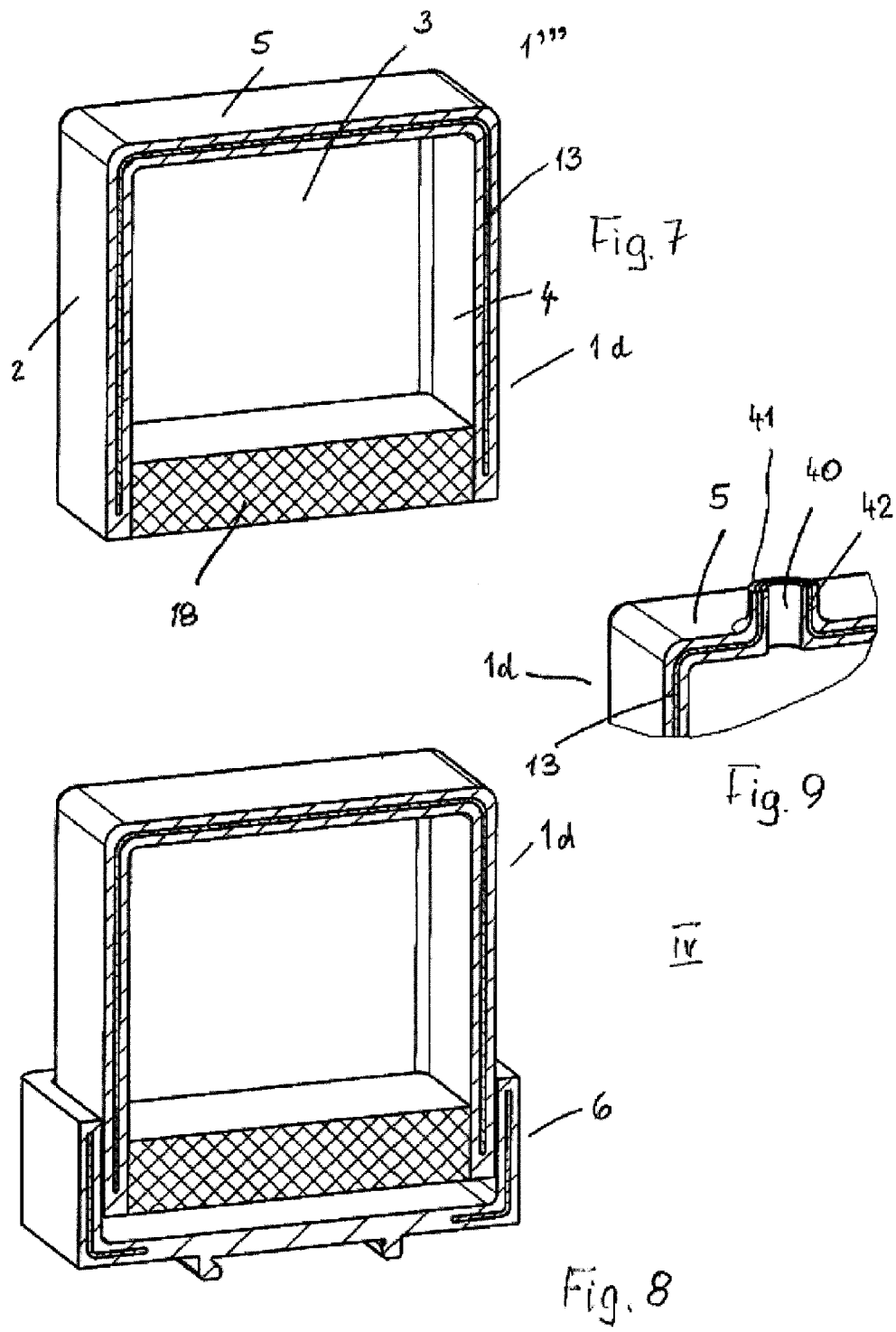

HOUSING FOR AN ELECTRICAL DEVICE

BACKGROUND OF THE INVENTION

The invention concerns a housing or case for an electrical device comprising sidewalls and a cover that together enclose an explosion-protected interior in which electric/electronic components are arranged and comprising at least one reinforcement that is arranged within the sidewalls.

Such housings or cases accommodate electromechanical, electric and electronic components. Connecting leads can be embedded in the sidewalls of the case. The connecting leads provide an increase in strength of the case that forms a pressure resistant enclosure. However, such a case is suitable only for relatively low explosion pressures.

The object of the invention is therefore to embody a case of the aforementioned kind in such a way that it is suitable also for higher explosion pressures while it can be produced in a simple way and is of a simple configuration.

SUMMARY OF THE INVENTION

This object is solved for a case of the aforementioned kind in that the reinforcement extends into the cover.

The case according to the invention is suitable for high explosion pressures because the case reinforcement extends from the sidewalls into the cover of the case. It is ensured in this way that the walls and the cover of the case do not expand or deform and especially are not destroyed when subjected to explosion pressure. For this reason the case according to the invention can be constructed to have a large size because the pressure resistance is high on account of the case reinforcement.

Advantageously, the case reinforcement may extend across the whole surface of the cover. An optimally high pressure resistance of the case according to the invention is provided in this way.

An especially simple configuration and manufacture of the case reinforcement arises when it is formed as a deep-drawn part. Then the case reinforcement can be produced in a simple and an inexpensive way from a sheet metal part by a deep-drawing process.

The case reinforcement is embodied advantageously of a cup shape so that in the sidewalls and in the cover, respectively, a reinforcing action that is provided across the entire surface is guaranteed. Such a case can therefore have large dimensions.

The deep-drawn part can be embodied in the manner of a perforated plate. A flat and fixed connection is thereby possible between the case reinforcement and the case. The case usually consists of plastic material that extends through the perforations of the perforated plate and provides thus a form-locking or positive-locking connection between the material of the case and the case reinforcement.

It is also possible that the deep-drawn part has closed walls (no perforations). In this embodiment, the case reinforcement ensures an especially high pressure resistance of the case.

When the case reinforcement is provided at least partially as a current conducting component, the case reinforcement may also serve as a current lead.

In this case, it is advantageous when the case reinforcement is formed from individual electrically conducting elements that are held together by at least one securing element. By means of the individual electrically conducting elements certain components within the case can be supplied in a targeted fashion with current/voltage. The securing element ensures that these elements are held together. In this connection, it is advantageous that the electrically conducting elements and the securing element form together an assembly. This assembly can then simply be placed into an injection mold and embedded by injection-molding in the plastic material forming the case.

In order to ensure a high pressure resistance by means of a case reinforcement embodied in this way, the securing element consists advantageously of a high-tensile strength material, like carbon-reinforced or fiberglass-reinforced plastic material, with appropriate electric insulating properties.

It is an advantage when electric connectors are connected to some of the electrically conducting elements of the case reinforcement. These connectors can be embodied, for example, in the manner of a strain-relief clamp system or a spring contact.

Advantageously, these connectors are connected to the free ends of the electrically conducting elements that project from the cover of the case.

In order to have these electric connectors isolated properly, they are accommodated advantageously in an insulating body.

The insulating body is arranged advantageously on the cover and can be screwed on, snapped on, glued on, or fastened in other way.

Some of the electrically conducting elements can project past the edge of the sidewalls of the case so that electric lines or leads (conductors) can be connected to these projecting elements.

It is possible to provide the cover of the case with at least one case opening with a suitable seal through which a line or the like can be passed to the exterior.

This case opening can be delimited advantageously by a collar projecting away from the cover. Also, this case opening can have an ex-limiting gap (explosion limiting gap) for receiving a plunger or actuation pin for the purposes of explosion protection.

In the collar a reinforcement part may also be embedded so that the mechanical strength is thereby also significantly increased in this area.

This reinforcement part is embodied advantageously to be monolithic with the case reinforcement of the case so that it is not necessary to provide two separate reinforcement components.

The case according to the invention can be closed by a bottom. However, it is also possible to form the case from a case part and a holding frame that is engaged by the case part.

This holding frame has advantageously a bottom and lateral frame walls.

Expediently, at least the lateral frame walls of the holding frame are provided with a frame reinforcement so that also the holding frame exhibits a high pressure resistance.

It is advantageous when at least a part of the bottom of the holding frame is provided with a bottom reinforcement.

This bottom reinforcement is advantageously a part of the lateral reinforcement in the lateral frame walls of the holding frame. It is then only necessary to have a single frame reinforcement for the holding frame so that the production of the holding frame is simplified.

In the mounted state the frame reinforcement of the holding frame overlaps advantageously the case reinforcement of the case part. In this way it is achieved that the complete case is provided with a reinforcement action so that an especially high pressure resistance is achieved.

The case part is fastened advantageously such that the outside of its sidewalls contacts the inside of the lateral frame walls of the holding frame, for example, by gluing or welding.

A lasting, safe and seal-tight connection is thereby created between the case part and the holding frame.

Advantageously, the case part is closed or sealed at its end facing the holding frame by a potting compound. In this way, it is possible to insert in a simple way the respective components into the case part. Afterwards the case part is closed or sealed by the potting compound that can be, for example, a potting resin such as polyurethane resin or epoxy resin.

However, it is also possible that the potting compound is provided in a receiving space that is formed between the sidewalls of the case part and the lateral frame walls of the holding frame. In this embodiment, the case part itself must not have any potting compound. This has the advantage that the interior of the case part is increased so that with the same overall size of the case more mounting space is available for the parts to be accommodated in it.

BRIEF DESCRIPTION OF THE DRAWINGS

Further features of the invention will be apparent from the dependent claims, the description, and the drawings.

The invention will be explained with the aid of some embodiments shown in the drawings in more detail.

FIG. 7 shows in a representation according to FIG. 1 a further embodiment of a case according to the invention, FIG. 8 shows in a representation according to FIG. 1 a further embodiment of a case according to the invention, FIG. 9 shows in section an "ex d" explosion-protected case opening of the case according to the invention ("ex d" relates to pressure resistant encapsulation according to European Standard EN 60079).

DESCRIPTION OF PREFERRED EMBODIMENTS

Figure 1:
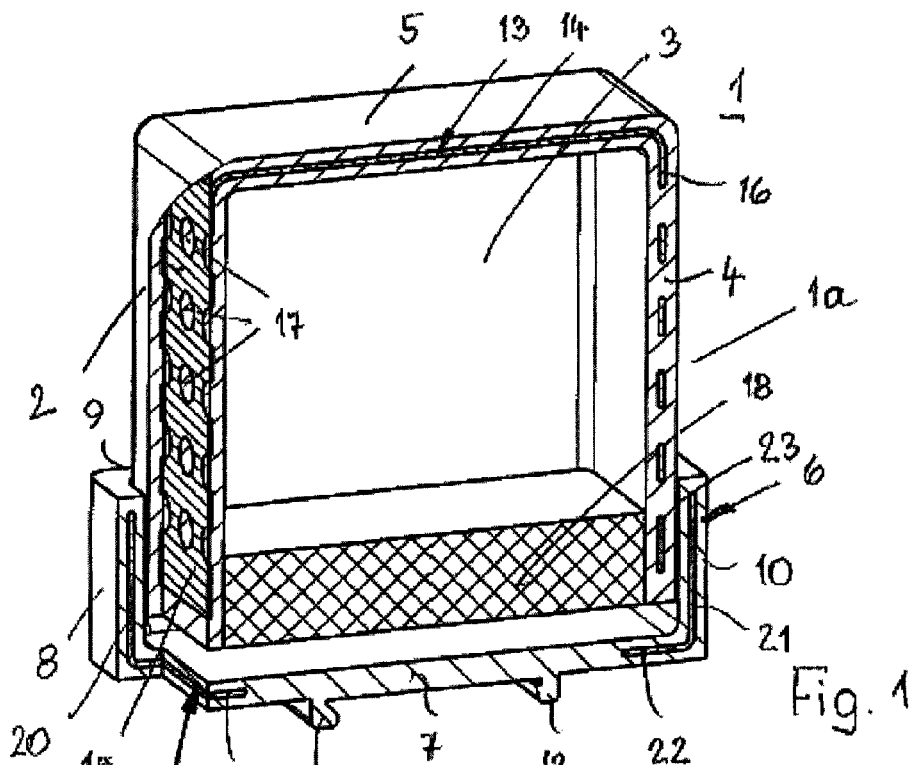
FIG. 1 shows in a perspective representation and in part sectional view the first embodiment of a case according to the invention.

The case 1 according to FIG. 1 is suitable as an explosion-protected (ex-protected) case that exhibits a high pressure resistance in spite of a large inside volume.

The case 1 according to FIG. 1 has a case part 1a with sidewalls 2 to 4 that are connected by a cover 5 with each other. The sidewalls 2 to 4 and the cover 5 are produced monolithically with each other of plastic material. One sidewall of case 1 of parallelepipedal shape is not shown in FIG. 1. The sidewalls 2 to 4 are of equal length and engage with their free ends a cup-like holding frame 6. The sidewalls can be also of different length. The holding frame 6 is also embodied monolithically of plastic material and has a bottom 7 from which lateral frame walls 8 to 10 of equal height project perpendicularly. However, the lateral frame walls can be also be of different height. The sidewalls 2 to 4 contact with their outer side the insides of the lateral frame walls 8 to 10 and are connected pressure-tightly with them. The free ends of the sidewalls 2 to 4 may be spaced from the bottom 7 of the holding frame 6. In the embodiment the lateral frame walls 8 to 10 extend about less than half the height of the sidewalls 2 to 4. Depending on the application of the inventive case, the lateral frame walls 8 to 10 may have also different heights.

At the underside of the bottom 7 there are holding webs 11, 12 which are positioned parallel to each other and extend advantageously about the whole width of the bottom 7. The holding webs 11, 12 are embodied advantageously monolithically with the bottom 7. By means of them, the case is fastened in a known manner on support rails.

The case part 1a is provided with a case reinforcement 13, by which the case 1 is provided with the necessary pressure resistance. The case reinforcement 13 is formed by a cup having a bottom 14 resting against the cover 5 and sidewalls 15, 16 resting against the sidewalls 2 to 4 of the case 1. The case reinforcement 13 consists of metallic material and is embedded completely in the case 1.

In the illustrated embodiment the sidewalls 15, 16 as well as the bottom 14 of the cup-shaped case reinforcement 13 are provided with perforations 17 that may have different contour shapes. The perforations 17 reduce the weight of the case reinforcement 13. Moreover, they provide that the case reinforcement 13 is securely anchored in the case part 1a because the plastic material of the case part 1a penetrates the perforations 17. As a material for the case part 1a, for example, polyamide or polycarbonate is considered.

The case reinforcement 13 is produced in the shown embodiment in a cup shape from deep-drawn sheet metal. However, as a case reinforcement a wire mesh may also be used, for example, which is then embedded in the same way as the deep-drawn sheet metal in the plastic material of the case part 1a.

For producing the case part 1a the case reinforcement 13 is inserted into an injection mold and afterwards embedded in the plastic material by injection molding. After its completion the case part 1a is open at the underside so that the electric/electronic parts and components to be accommodated in the case part 1a can be simply mounted. After assembly of these parts the bottom of the case part 1a is closed by a potting compound 18. It may consist of potting resin, for example, polyurethane resin or epoxy resin. Instead of the potting resin any other suitable material can be used also for seal-tightly closing the case part.

The holding frame 6 is also provided with a frame reinforcement 19 that is embedded in the bottom 7 and the lateral frame walls 8 to 10. The frame reinforcement 19 has a lateral reinforcement in the form of walls 20, 21 that are embedded in the lateral frame walls 8 to 10 of the holding frame 6. At the lower end the walls 20, 21 are bent at a right angle to a circumferentially extending bottom reinforcement 22 that is embedded in the bottom 7 of the holding frame 6.

The frame reinforcement 19 is produced advantageously also of deep-drawn sheet metal and can be provided, just like the case reinforcement 13, with perforations. However, the frame reinforcement 19 can also consist in an exemplary fashion of an appropriately bent wire mesh.

The holding frame 6 is connected to the case part 1a after the latter has been closed with the potting compound 18. The holding frame 6 can be connected in different ways to the case part 1a, for example, by gluing, welding, snap-on connections, screwing together and the like. It is also possible to provide a plug-in connector in the sense that the case part 1a and the holding frame 6 are connected positive-lockingly with each other. In the shown embodiment an adhesive layer 23 that connects both parts fixedly and seal-tightly with each other is provided between the lateral frame walls 8 to 10 of the holding frame 6 and the sidewalls 2 to 4 of the case part 1*a*.

The case part 1*a* is embodied in the illustrated embodiment approximately of a parallelepipedal shape. Of course, it can have also another shape, for example, a cylindrical shape.

Figure 2:
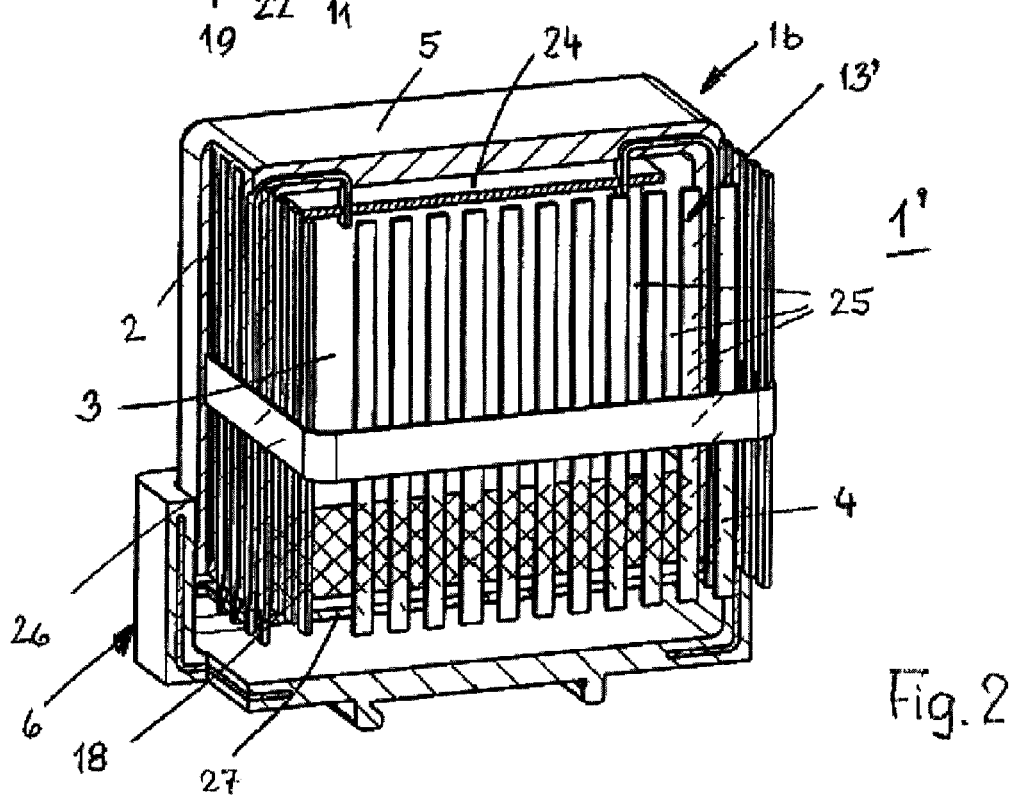
FIG. 2 shows in a representation according FIG. 1 the second embodiment of a case according to the invention, with a case reinforcement that is partly current-conducting.

The embodiment according to FIG. 2 differs from the preceding embodiment essentially in that the case reinforcement 13' serves at the same time also for conducting current. In the case part 1*b* of the case 1' a printed circuit board 24 is arranged that in an exemplary fashion is arranged at small distance below the cover 5 of the case part 1*b*.

The case reinforcement 13 is provided with individual current conducting elements 25 positioned side by side and, for example, formed by rails. They can consist, for example, of electrolyte copper, of suitable alloys, such as copper kneading alloys or copper zinc alloys, and the like. Advantageously, the current conducting elements 25 are provided with a surface protection. For this purpose, they can be tin-plated or nickel-plated, for example. The current conducting elements 25 are embedded in the sidewalls 2 to 4 of the case part 1*b*. The current conducting elements 25 are connected by at least one securing element 26 with each other that is embodied advantageously as a strap and is formed of a high-strength plastic material. The securing element 26 is arranged approximately at half the length of the current conducting elements 25 and surrounds them. The securing element 26 can be connected in any suitable manner fixedly with the current conducting elements 25. The securing element 26 can consist, for example, of carbon-fiber reinforced or fiberglass-reinforced plastic material. The current conducting elements 25 and the securing element 26 are joined to an assembly that is subsequently inserted into an injection mold and embedded by injection molding in plastic material for forming the case part 1*b*.

As with the preceding embodiment the case part 1*b* is sealed with the potting compound 18 after assembly of the electronic/electric components.

In contrast to the preceding embodiment, the case reinforcement 13' projects downwardly from the sidewalls 2 to 4 of the case part 1*b*. The lower ends of the current conducting elements 25 project into the holding frame 6; the holding frame 6 is of the same configuration as in the preceding embodiment. A printed circuit board 27 is inserted into the holding frame 6 and can be connected with some or all of the current conducting elements 25, depending on the inner configuration of the case 1*b*.

The current conducting elements 25 are properly electrically separated from each other by means of the securing element 26 that consists of electrically insulating material. To the current conducting elements 25 potentials that differ greatly can be applied that, in turn, can be contacted differently. For contacting, for example, a terminal connector, a printed circuit terminal, a soldered connection with lead terminals and the like can be provided. Such a configuration of the case 1*b* permits therefore various configurations so that the case can be optimally adapted to a desired application.

As shown in FIG. 2 in an exemplary fashion, two of the current conducting elements 25 are bent at the upper end approximately in a U-shape. The angled ends are embedded in the cover 5 and project downwardly from it. The free end is connected with the printed circuit board 24 in an electrically conducting way.

Figure 4:
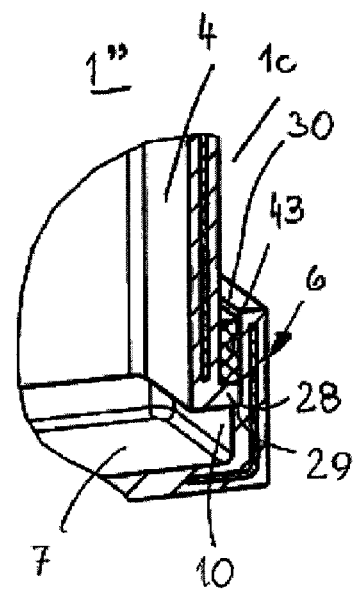
FIG. 4 shows in enlarged representation the connecting area between a holding frame and the sidewalls of a case according to the invention of a further embodiment.

FIG. 4 shows the possibility to fasten the holding frame 6 to the case part 1*c* by means of a potting compound 43. The sidewalls 2 to 4 of the case part are provided for this purpose at the lower end with a perpendicularly outwardly projecting edge 28 that is resting against the inside of the lateral frame walls 8 to 10 of the holding frame 6 when the case 1" is mounted. The lateral frame walls 8 to 10 of the holding frame 6 are provided on the inner side with a step 29 on which the edge 28 of the case part 1*c* is seated. On account of the step 29 the lateral frame walls 8 to 10 are made thinner at their upper end in comparison to the area that adjoins the bottom 7.

On account of the described embodiment between the lower end of the sidewalls 2 to 4 of the case part 1*c* and the upper area of the lateral frame walls 8 to 10 of the holding frame 6 a circumferentially extending receiving space 30 is formed into which the potting compound 43 is introduced by means of which the holding frames 6 and the case part 1*c* are connected fixedly and seal-tightly with each other. Since the potting compound 43 is arranged between the sidewalls of the case part 1*c* and the holding frame 6, the lower end of the case part 1*c* must not be closed by a potting compound. The space otherwise required for this potting compound is thus available as a mounting space.

In other respects, the case 1" according to this embodiment is embodied according to FIG. 1 or the FIGS. 2, 3 or according to the embodiments to be still described in the following.

Figure 3:
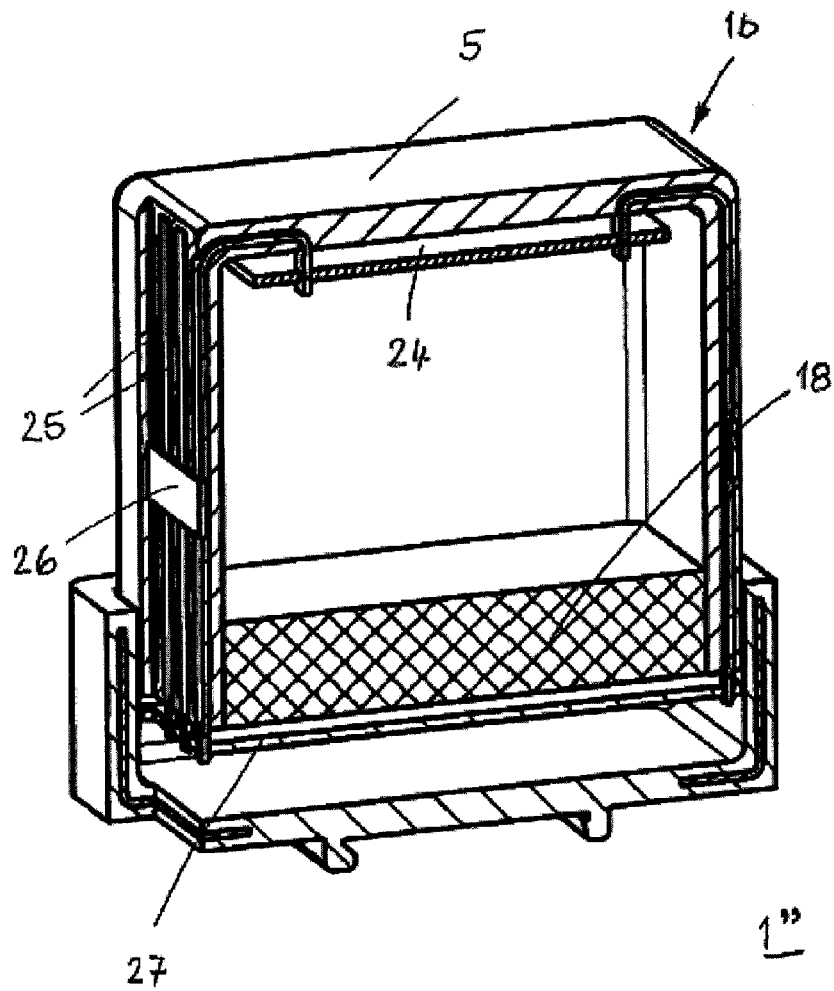
FIG. 3 shows a portion of the case according to FIG. 2.
Figure 5:
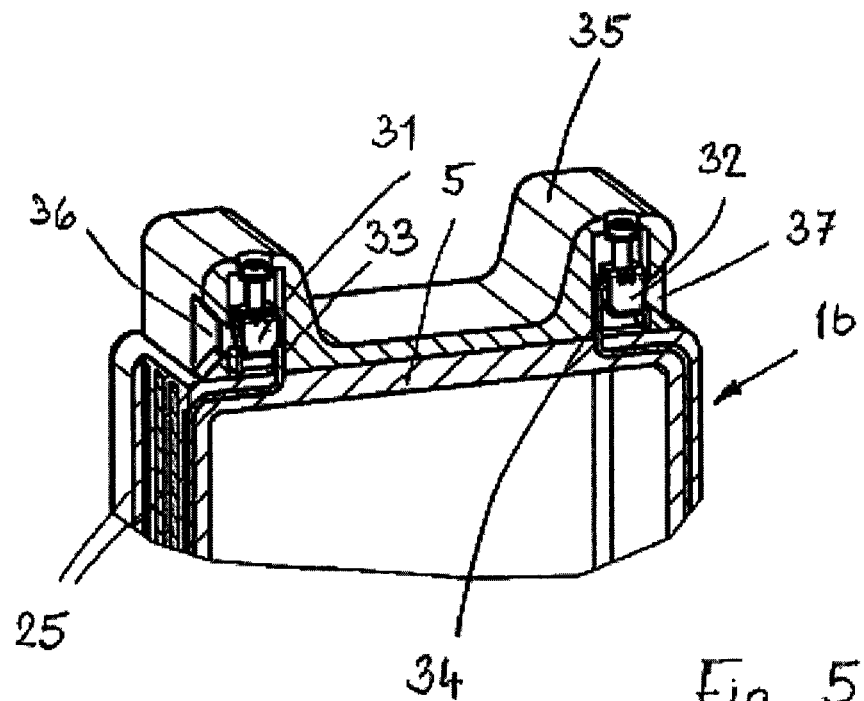
FIG. 5 shows in an enlarged representation a portion of a further embodiment of a case according to the invention which has terminals instead of a printed circuit board.

FIG. 5 shows the possibility of connecting for the case according to FIGS. 2 and 3 terminal connectors 31, 32 to the corresponding current conducting elements 25. In this situation, the upper ends of the appropriate current conducting elements 25 are formed approximately Z-shaped and the middle section is embedded in the cover 5 of the case part 1*b* and the free end projects upwards away from the cover 5. The terminal connectors 31, 32 are fastened to these projecting ends 33, 34 of the current conducting elements 25. They can be embodied, for example, in the form of a strain-relief clamp system or a spring contact. The terminal connectors 31, 32 are accommodated in an insulating body 35 that is fastened to the cover 5, for example, screwed on, snapped on, or glued on. The insulating body 35 is embodied with a raised portion in the area of the terminal connectors 31, 32. In order to be able to connect from the outside the suitable electric lines or leads to the terminal connectors 31, 32, the insulating body 35 is provided with access openings 36, 37 by means of which from the outside the electric lines or leads can be guided to the terminal connectors and connected with them. The insulating body 35 is embodied advantageously with high creep resistance.

Figure 6:
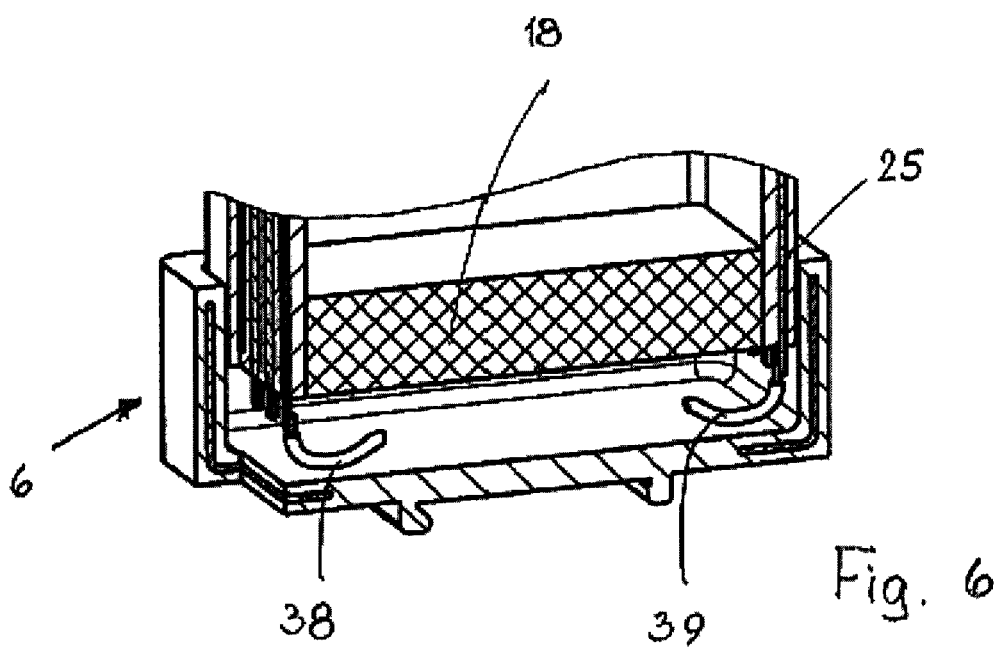
FIG. 6 shows in section a portion of a further embodiment of a case according to the invention which is provided with electric lines or leads.

FIG. 6 shows the possibility, already mentioned, of connecting the electric lines or leads 38, 39 that are embodied so as to meet the explosion protection guidelines to the lower end of the suitable current conducting elements 25 projecting downwardly past the potting compound 18 into the holding frame 6.

The FIG. 7 shows a case 1''' in which the case reinforcement 13 as in the embodiment of FIG. 1 is produced in a cup shape by deep-drawing a suitable sheet metal. In contrast to the embodiment of FIG. 1 no perforations are provided in the deep-drawn sheet metal. The case reinforcement 13 is embedded completely in the case part 1*d* and is provided in its sidewalls 2 to 4 and in its cover 5. In other respects, the case part 1*d* is of the same configuration as the case part 1*a* according to FIG. 1. In contrast to the preceding embodiments the case 1''' has no holding frame, but is formed by the case part 1*d* and the potting compound 18 sealing it.

FIG. 8 shows the possibility to insert the case part 1*d* in the described manner into the holding frame 6 that is of the same configuration as the embodiment of FIG. 1. The holding frame 6 and the case part 1*d* may also be embodied according to FIG. 4.

FIG. 9 shows the possibility of providing at least one "ex d" (pressure resistant encapsulation according to European Standard EN 60079) case opening 40 in the cover 5 of the case part 1*d*. It is delimited by an upwardly bent edge 41 embodied monolithically with the cover 5. The edge 41 is also provided with a part 42 of the case reinforcement 13. This reinforcement part 42 is embedded completely in the edge 41 and can extend up to its end face. The reinforcement part 42 can be formed by means of a necking process on the case reinforcement 13. This case opening can also have an ex-limiting gap (explosion limiting gap) for receiving a plunger or actuation pin for the purposes of explosion protection.

In the described embodiments the cases 1, 1', 1'', 1''' are formed by the case part 1*a* to 1*d* and the holding frame 6, respectively. This two-part embodiment has the advantage that both parts can be provided with the reinforcements 13, 19, respectively. In mounted position, the reinforcements 13, 19 overlap each other by a sufficient length so that a high pressure resistance of the case is reached. The overlapping area of the sidewalls 2 to 4 of the case part and of the lateral frame walls 8 to 10 of the holding frame 6 is so large that a connection of satisfactorily strength is ensured between both parts. In the two-part embodiment, as a result of metallic reinforcement all around, the case is suitable for a higher internal pressure in an explosion situation, without there being the danger that during the explosion the case will expand or deform or even rupture.

The specification incorporates by reference the entire disclosure of the German priority application DE 10 2009 037 948.7 having a filing date of Aug. 18, 2009.

While specific embodiments of the invention have been shown and described in detail to illustrate the inventive principles, it will be understood that the invention may be embodied otherwise without departing from such principles.

What is claimed is:

1. A case for an electric device comprising:
    a case part comprising sidewalls and a cover connected to the sidewalls;
    wherein the sidewalls and the cover enclose an explosion-protected interior in which electric and/or electronic components are accommodated;
    a case reinforcement that is disposed in the sidewalls and in the cover;
    wherein the case reinforcement is provided at least partially as a current conducting component that is comprised of individual electrically conducting elements held together by at least one securing element, wherein the at least one securing element is comprised of high tensile strength material.

2. The case according to claim 1, wherein the high tensile strength material is carbon fiber-reinforced or fiberglass-reinforced plastic material.

3. The case according to claim 1, comprising electric connectors that are connected to some of the individual electrically conducting elements.

4. The case according to claim 3, wherein the individual electrically conducting elements have free ends that project from the cover, wherein the electric connectors are arranged in an insulating body and are connected to the free ends of the individual electrically conducting elements.

5. The case according to claim 4, wherein the insulating body is disposed on the cover.

6. The case according to claim 3, wherein some of the individual electrically conducting elements project past an edge of the sidewalls and are adapted to be connected to electrical lines.

7. A case for an electric device comprising:
    a case part comprising sidewalls and a cover connected to the sidewalls;
    wherein the sidewalls and the cover enclose an explosion-protected interior in which electric and/or electronic components are accommodated:
    a case reinforcement that is disposed in the sidewalls and in the cover;
    wherein the cover is provided with at least one case opening that is delimited by a collar projecting from the cover, wherein the collar comprises a reinforcement part.

8. The case according to claim 7, wherein the reinforcement part is monolithic with the case reinforcement disposed in the sidewalls and the cover.

9. A case for an electric device comprising:
    a case part comprising sidewalls and a cover connected to the sidewalk;
    wherein the sidewalls and the cover enclose an explosion-protected interior in which electric and/or electronic components are accommodated;
    a case reinforcement that is disposed in the sidewalls and in the cover;
    a holding frame in which the case part is received.

10. The case according to claim 9, wherein the holding frame has a bottom and lateral frame walls and comprises a frame reinforcement.

11. The case according to claim 10, wherein the frame reinforcement comprises a lateral frame reinforcement disposed in the lateral frame walls.

12. The case according to claim 11, wherein at least a portion of the bottom of the holding frame is provided with a bottom reinforcement, wherein the bottom reinforcement of the holding frame and the lateral frame reinforcement of the lateral frame walls together form a monolithic frame reinforcement.

13. The case according to claim 10, wherein the frame reinforcement of the holding frame overlaps the case reinforcement of the case part, wherein the outer side of the sidewalls of the case part rests against and is fastened to the inner side of the lateral frame walls of the holding frame, wherein the case part is closed by a potting compound at an end positioned inside the holding frame.

14. The case according to claim 9, wherein between the sidewalls of the case part and lateral frame walls of the holding frame a receiving space is provided for receiving a potting compound.

* * * * *